US006916371B2

(12) United States Patent
Lan

(10) Patent No.: US 6,916,371 B2
(45) Date of Patent: Jul. 12, 2005

(54) APPARATUS FOR GROWING STOICHIOMETRIC LITHIUM NIOBATE AND LITHIUM TANTALATE SINGLE CRYSTALS AND METHOD OF GROWING THE SAME

(75) Inventor: Chung-Wen Lan, Taipei Hsien (TW)

(73) Assignee: National Taiwan University, Taipei (TW)

( * ) Notice: Subject to any disclaimer, the term of this patent is extended or adjusted under 35 U.S.C. 154(b) by 17 days.

(21) Appl. No.: 10/604,616

(22) Filed: Aug. 5, 2003

(65) Prior Publication Data

US 2004/0103840 A1 Jun. 3, 2004

Related U.S. Application Data

(62) Division of application No. 10/064,880, filed on Aug. 27, 2002.

(30) Foreign Application Priority Data

Feb. 27, 2002 (TW) ........................................ 91103520 A

(51) Int. Cl.$^7$ .............................................. C30B 15/20
(52) U.S. Cl. ........................ 117/18; 117/214; 23/295 R
(58) Field of Search ............................ 117/13, 18, 214; 23/295 R; 422/250

(56) References Cited

U.S. PATENT DOCUMENTS

| 3,953,174 | A | * | 4/1976 | LaBelle, Jr. ................. 117/210 |
| 4,187,139 | A | * | 2/1980 | Brice et al. .................. 117/906 |
| 4,623,423 | A | * | 11/1986 | Aubert et al. ................. 117/13 |
| 5,938,841 | A | * | 8/1999 | Kitagawa et al. .............. 117/30 |
| 6,074,477 | A | * | 6/2000 | Imaeda et al. ................. 117/13 |
| 6,464,777 | B2 | * | 10/2002 | Kitamura et al. .............. 117/13 |

* cited by examiner

*Primary Examiner*—Felisa Hiteshew
(74) *Attorney, Agent, or Firm*—Chyun IP Office

(57) ABSTRACT

A method for growing stoichiometric lithium niobate and lithium tantalate single crystals is provided. A crystal growing apparatus that includes a long crucible with a separation member therein is used. A solid feed material is quenched from a molten state, solidified in batches or sintered before charged in the long crucible to obtain substantially stoichiometric solids. The separation member divides the long crucible into a melting zone and a feeding zone located under the melting zone, and it could effectively prevent bubble formation in the growing crystal. The stoichiometry of the axial and radial composition can be well controlled, and the control of the diameter of the crystal body is easily achieved as well.

9 Claims, 6 Drawing Sheets

APPARATUS FOR GROWING STOICHIOMETRIC LITHIUM NIOBATE AND LITHIUM TANTALATE SINGLE CRYSTALS AND METHOD OF GROWING THE SAME

CROSS REFERENCE TO RELATED APPLICATIONS

This application is a divisional of a prior application Ser. No. 10/064,880, filed Aug. 27, 2002, which claims the priority benefit of Taiwan application Ser. No. 91103520, filed Feb. 27, 2002.

BACKGROUND OF INVENTION

1. Field of the Invention

The present invention relates to a method of growing single crystals. More specifically, the present invention relates to a method of growing substantially stoichiometric lithium niobate (LN) and lithium tantalate (LT) single crystals.

2. Description of the Related Art

LN and LT crystals have been widely used as a photoelectric material, especially for photo-transmission, audio and visual appliance, double-frequency laser, and optical storage medium. A conventional method of growing LN and LT crystals, called as Czochralski method (Cz method), is well known in the art and as described hereafter.

FIG. 1 and FIG. 2 respectively show phase diagrams of a congruent composition with lithium and niobium or lithium and tantalum. Here, a composition with a stoichiometric/non-stoichiometric amount of reactants is also called a stoichiometric/non-stoichiometric composition. That is, in the congruent composition, the mole ratio of lithium to niobium or lithium to tantalium is not about 50%. Therefore, a crystal body obtained by the conventional Cz method usually has a non-stoichiometric composition. However, stoichiometric LN and LT crystals are preferable because of their superior photoelectric properties. A method of continuously growing a stoichiometric LN and LT is thus needed.

Recently, a double-crucible method has been proposed by National Institute for Research in Inorganic Materials (NIRIM), Japan. FIG. 3 is a schematic, cross-sectional view of an apparatus used in a conventional double-crucible method.

In FIG. 3, a melt with a lithium-rich composition for growth of crystals is placed in two separate crucibles. A conventional crystal growing apparatus 300 includes a chamber 302, an external crucible 304, an inner crucible 306, a heater 308, and a crystal pulling system 310. The crystal growing apparatus 300 is provided with a powder feeding system 312 for automatically charging the raw material having the stiochiometric composition. The external crucible 304 is arranged inside the chamber 302. The inner crucible 306 is arranged in the external crucible 304 and has a small opening 314 on the sidewall of the inner crucible 306 near a bottom thereof. The heater 308 surrounds the chamber 302, including a bottom and a sidewall thereof. The powder feeding system 312 is arranged outside the heater 308 and is provided with a tube 318 extending into the chamber 302. An outlet of the tube 318 is located between the external crucible 304 and the inner crucible 306. The crystal pulling system 310 is located above the inner crucible 306.

When the crystal growing process is performed, the solid raw material with about 58% Li is melted and entered into the inner crucible 306 and the external crucible 304 inside the chamber 302. Then, a crystal seed 320 is placed in the crystal pulling system 310 and dipped in the melt 322 within the inner crucible 306. The crystal seed 320 is pulled up at a constant speed while being rotated to grow a crystal body 324. As the crystal body 324 is gradually grown, the powder material 326 is added into the melt 328 within the external crucible 304 at a rate that can compensate the consumed material consumption. Meanwhile, the powder material 326 added in the melt 328 is continuously melted by the heater 308. The melt 328 flows into the inner crucible 306 through the opening 314 of the inner crucible 306. Thereby, the composition of the crystal body 324 can be constant.

The double-crucible method grows stoichiometric lithium niobate ($LiNbO_3$, LN) and lithium tantalate ($LiTaO_3$, LT) single crystals by keeping the composition of the melt 422 in the inner crucible 306 at point A of the phase diagram of FIG. 1 and FIG. 2. Theoretically, the stoichiometric crystals can be obtained as long as the charged amount of powder stuff 326 is precisely controlled to grow the crystal body 324. Automatically feeding powder stuff is requisite for the double-crucible method to grow the stoichiometric crystals. However, it needs high level technology and high production cost. Further, in consideration of thermal aspect, there is a significant difference between the melting points of the melt 322 and 328 respectively in the inner crucible 306 and the external crucible 304, which causes the control of the heater 308 difficult. Therefore, the double-crucible method is difficult to be commercialized at a large scale.

SUMMARY OF INVENTION

It is an object of the present invention to provide a method of growing stoichiometric lithium niobate and lithium tantalate single crystals and an apparatus therefor. With the method of the invention, it is easier to obtain the stoichiometric single crystals.

It is another object of the present invention to provide a method of growing stoichiometric lithium niobate and lithium tantalate single crystals and an apparatus therefor, in which the uniformity of the composition of the single crystal can be improved.

It is still another object of the present invention to provide a method of growing stoichiometric lithium niobate and lithium tantalate single crystals and an apparatus therefor, in which a diameter of the crystal can be easily controlled.

It is still another object of the present invention to provide a method of growing stoichiometric lithium niobate and lithium tantalate single crystals and an apparatus therefor, in which power consumption is reduced and thus the production cost is decreased.

In order to achieve the above and other objectives of the invention, a crystal growing apparatus of growing stoichiometric lithium niobate and lithium tantalate single crystals is provided. The crystal growing apparatus includes a chamber, a long crucible, a heating system, a separation member, a pushing/rotating system and a crystal pulling system. The long crucible is provided with a separation member a melting zone and a feeding to define a.feeding zone and a melting zone. The provision of the separation member further prevents bubbles generated when the solid feed material is melted from being included in the crystal body. The solid feed material can be quenched from a molten state, solidified in batches or sintered to obtain stoichiometric solids before charged into the feeding zone of the long crucible. With the design of the melting zone in the apparatus of the present invention, the axial composition and radial composition can be controlled well. Thereby, substantially stoichiometric lithium niobate and lithium tantalate single crystals can be obtained.

Furthermore, a method of growing stoichiometric lithium niobate and lithium tantalate single crystals using a crystal growing apparatus is also provided. The crystal growing apparatus includes a chamber, a long crucible, a heating system, a pushing/rotating system and a crystal pulling system. In the method of the claimed invention, a solid feed material charged into a lower portion of the long crucible is kept in a solid state. A zone stuff is charged into the long crucible above the solid feed material. The solid feed material can be quenched from a molten state, solidified in batches or sintered before charged into the long crucible in order to grow substantially stoichiometric lithium niobate and lithium tantalate single crystals.

In another aspect of the invention, a method of growing stoichiometric lithium niobate and lithium tantalate single crystals by using at least a long crucible and an external heater is provided. A solid feed material is charged into the long crucible. A separation member is placed into the long crucible. A solid feed material is placed into the long crucible on the separation member, and then gradually melted by the external heater. The long crucible is pushed upward as a crystal body is grown. The zone stuff is separated from the solid feed material by the separation member to further control an admix rate of solid feed material/zone stuff. The provision of the separation member further prevents bubbles generated when the solid feed material is melted from being included in a crystal body. The ratio of the pulling rate of the crystal body and the pushing rate of the long crucible is in proportion to the ratio of the sinner cross section area of the long crucible and the cross section area of the crystal body in order to obtain the crystal body with uniform composition. Preferably, the ratio of the pulling rate of the crystal body to the pushing rate of the long crucible is substantially equal to the ratio of the inner cross section area of the long crucible to the cross section area of the crystal body.

In still another aspect of the invention, an apparatus for growing stoichiometric lithium niobate and lithium tantalate single crystals is provided. The apparatus includes a chamber, a long crucible, a separation member or an inner crucible, a heating system, a pushing/rotating system, and a crystal pulling system. The long crucible is arranged inside the chamber. The separation member, such as an insulative plate, a shallow crucible, or a crucible with perforated wall, is arranged in the long crucible to divide the long crucible into a melting zone and a feeding zone. The heating system surrounds a sidewall of the chamber, corresponding to locations of the melting zone and the feeding zone. Furthermore, the crystal pulling system is located above the chamber to pull up a crystal seed during crystal growth. The pushing/rotating system is located under the long crucible to rotate and push the long crucible up.

In still another aspect of the invention, an apparatus for growing stoichiometric lithium niobate and lithium tantalate single crystals is provided. The apparatus includes a chamber, a long crucible, a heating system, a pushing/rotating system, and a crystal pulling system. The long crucible is arranged inside the chamber. The heating system surrounds a sidewall of the chamber for melting solids therein. Furthermore, the crystal pulling system is located above the chamber for holding a crystal seed and pulling up the crystal seed during crystal growth. The pushing/rotating system is located under the long crucible to rotate and push the long crucible up.

In view of foregoing, with the use of the crystal growing apparatus of the present invention, in which the long crucible is provided with or not provided with a separation member, it is much easier to grow a crystal body with a controlled composition.

Furthermore, in the case of the crystal growing apparatus provided with the separation member, such as an insulative plate, a shallow crucible or a shallow crucible with a perforated wall is provided, the zone stuff in the melting zone is separated from the solid feed material in the feeding zone. The provision of the separation member further prevents bubbles generated when the solid feed material is melted from being included in the crystal body. If the separation member is a crucible with a shallow perforated wall, it is preferable to fix the separation member by three external Pt/Rh rods that are secured at an upper part of the long crucible. It is easy to take the separation member out of the long crucible after the crystal growth.

The solid feed material can be quenched from a molten state, solidified in batches or sintered before be charged the long crucible. Therefore, the composition of the grown crystal is more uniform.

In the apparatus of the present invention, the melting zone of the long crucible is located above the feeding zone of the long crucible. The solid feed material and the zone stuff are separately prepared and sequentially charged into the long crucible. Thereby, the stoichiometry of the axial and radial composition can be well controlled, and the control of the diameter of the crystal body is easily achieved as well.

Furthermore, the heat required for the present invention is applied around the sidewall of the external crucible, instead of the whole apparatus. Therefore, the energy can be saved and the production cost can be thus reduced.

BRIEF DESCRIPTION OF DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention.

DETAILED DESCRIPTION

Figure 1:
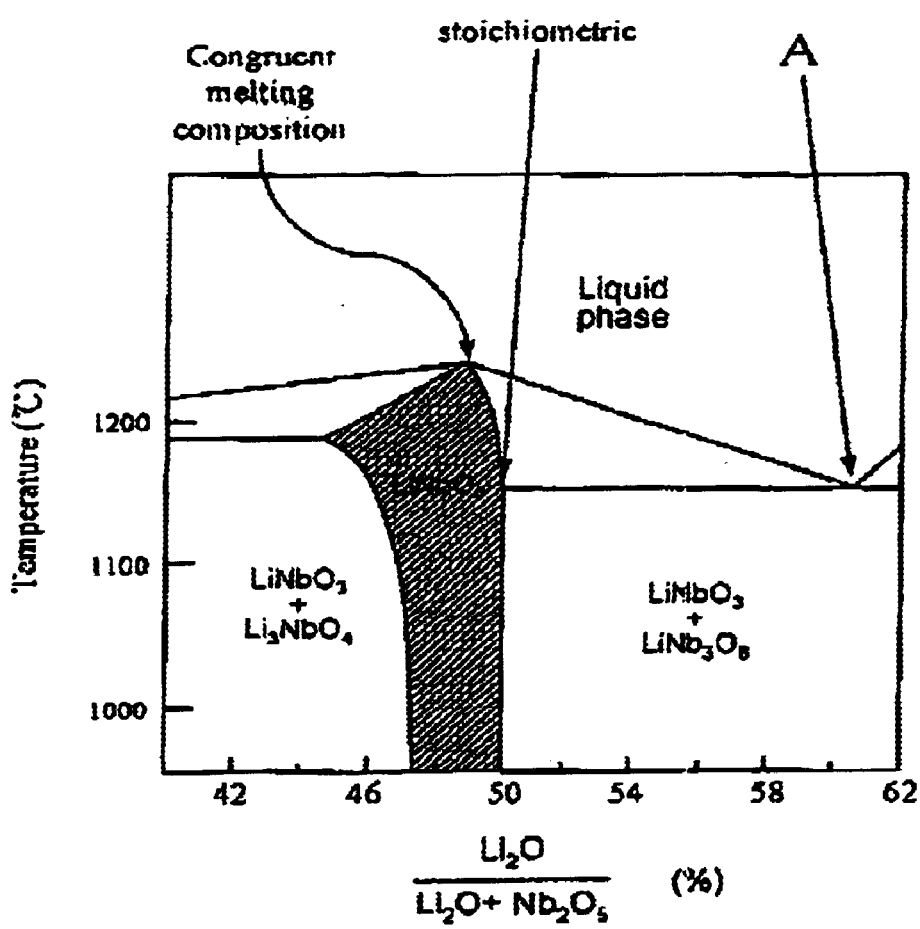
FIG. 1 is a phase diagram of $LiNbO_3$.

Reference will now be made in detail to the present preferred embodiments of the invention, examples of which are illustrated in the accompanying drawings. Whenever possible, the same reference numbers are used in the drawings and the description to refer to the same or like parts.

In the invention, a zone melting Czochralski method (hereafter, zone melting Cz method) is used. Stoichiometric lithium niobate (LN) and lithium tantalate (LT) single crystals are obtained by the zone melting Cz method that uses a crystal growing apparatus provided with a long crucible. The long crucible can be preferably provided with a separation member therein.

Figure 4:
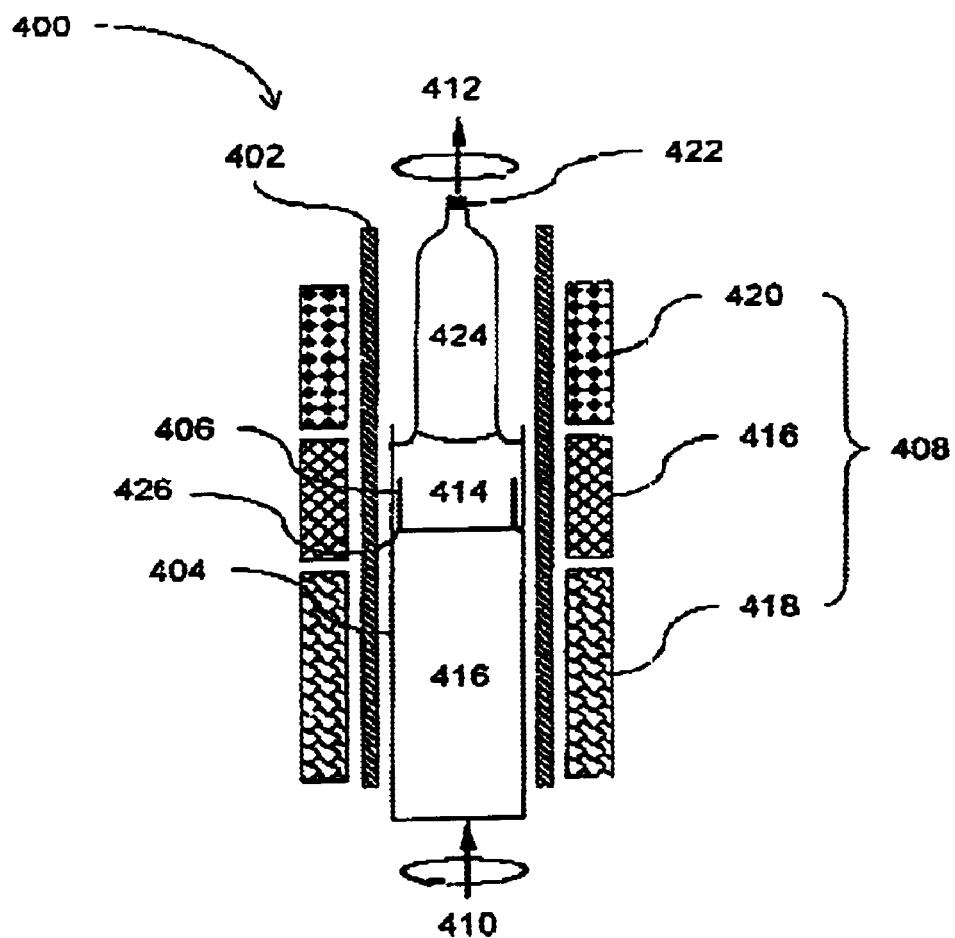
FIG. 4 is a schematic, cross-sectional view of an apparatus for growing stoichiometric lithium niobate and lithium tantalate single crystals according to one preferred embodiment of the present invention.

FIG. 4 is an apparatus for growing stoichiometric lithium niobate and lithium tantalate single crystals according to one preferred embodiment of the present invention. The crystal growing apparatus 400 includes a chamber 402, a long crucible 404, a separation member 406, a heating system 408, a pushing/rotating system 410 and a crystal pulling system 412. The long crucible 404 is arranged inside the chamber 402. The heating system 408 preferably surrounds sidewall of the chamber 402. The long crucible 404 particularly has a high wall. Preferably, the height of the wall of the long crucible 404 is larger than its diameter. The separation member 406 is arranged inside the long crucible 404 to define a melting zone 414 in an upper portion of the long crucible 404 and form a feeding zone 416 in a lower portion of the long crucible 404. The provision of the separation member 406 further prevents bubbles generated when the solid feed material is melted from being included in the crystal body. The separation member 406 can be an insulative plate, a shallow crucible, or a crucible with a perforated wall, for example. The separation member 406 can be made of, for example, platinum or iridium. The heating system 408 is arranged outside the chamber 402, corresponding to locations of the feeding zone 416 and the melting zone 414. The heating system 408 includes a preheater 418 for preheating the solid feed material in the feeding zone 416, and a post-heater 420 for gradually reducing a temperature of the grown crystal in the melting zone 414. The crystal pulling system 412 is arranged above the melting zone 414 for holding the crystal seed 422 and pulling up the crystal seed 422 during crystal growth. The pushing/rotating system 410 is located under the long crucible 404 to rotate and push up the long crucible 404 during crystal growth.

During crystal growth, the feeding zone 416 in the long crucible 404 is charged with a solid feed material. The solid feed material can be quenched from a molten state, solidified in batches or sintered before charged into the feeding zone 416 to obtain stoichiometric solids. Alternatively, a solid feed material prepared previously is charged into the long crucible. The separation member 406 is placed on the feeding zone 416 of the long crucible 404. Then, a zone stuff having composition at point A of FIG. 1 is placed into the long crucible 404.

Figure 5:
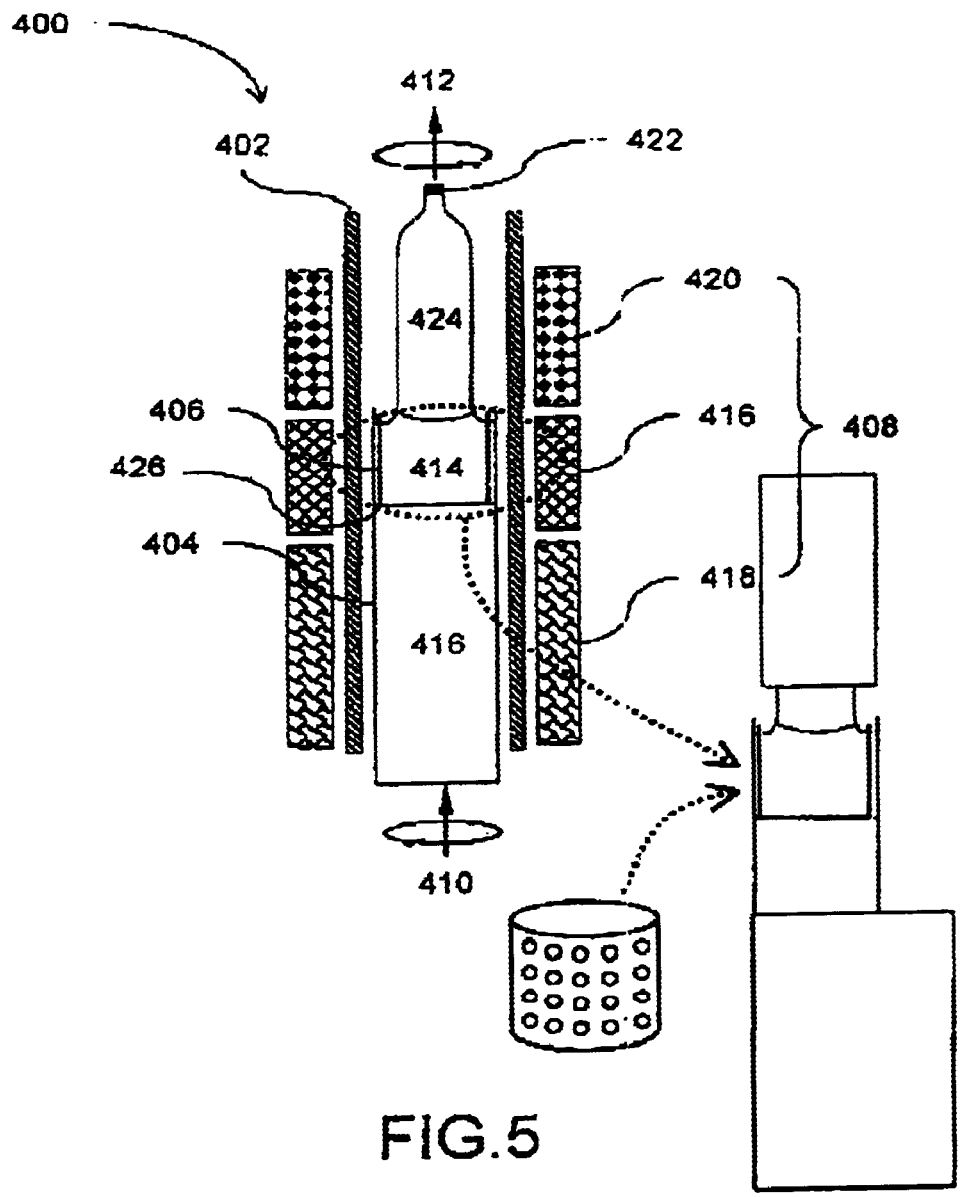
FIG. 5 is a schematic, cross-sectional view of an apparatus for growing stoichiometric lithium niobate and lithium tantalate single crystals according to another preferred embodiment of the present invention, wherein an example of a separation member is shown.

The separation member 406 used here can be an insulative plate, a shallow crucible (as shown in FIG. 4), or a crucible with a perforated wall (as shown in FIG. 5). The separation member 406 is provided and arranged over the feeding zone 416, then an admix rate of zone stuff/solid feed materila can be further controlled. If the separation member is a crucible with a shallow perforated wall, it is preferable to fix the separation member by three external Pt/Rh rods that are secured at an upper part of the long crucible. It is easy to take the separation member out of the long crucible after the crystal growth.

The separation member 406 is optionally provided. If the separation member 406 is not provided, a lower portion of the long crucible 404, where the solid feed material is located, is also called feeding zone 416. Similarly, an upper portion of the long crucible 404, where the zone stuff is located, is also called melting zone 414, as illustrated in the above embodiment shown in FIG. 4. The solid feed material in the feeding zone 416 is kept dense so that the solid feed material would not be affected by the temperature of the melting zone 414, and the formation of bubbles is minimized. This purpose can be achieved by densification or solidification of the solid feed material in the feeding zone 416. The condition of densification includes longer sintering time or the use of solid feed material with fine particles. The solidification is performed step-by-step so as to reduce the solidification rate or quenching from a molten state.

Figure 2:
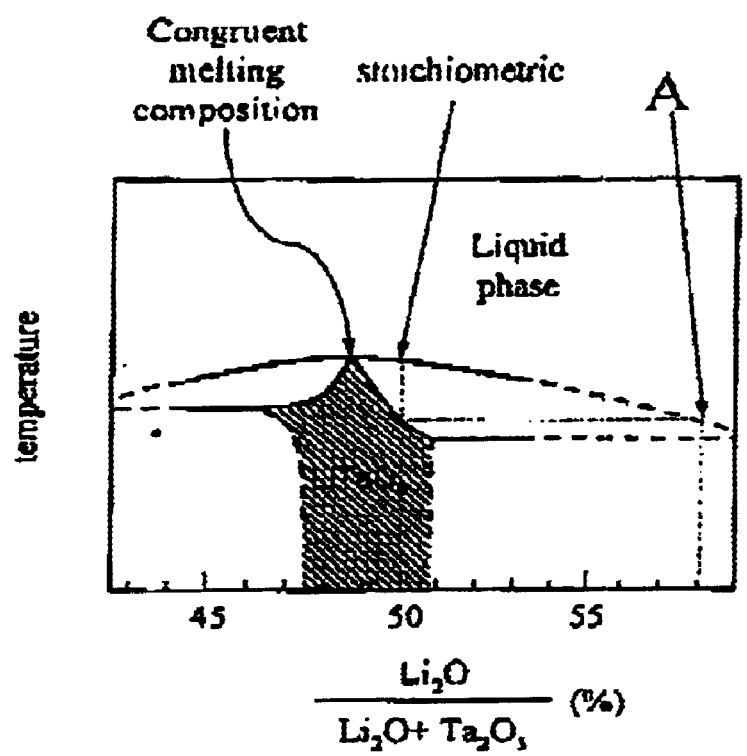
FIG. 2 is a phase diagram of $LiTaO_3$.
Figure 3:
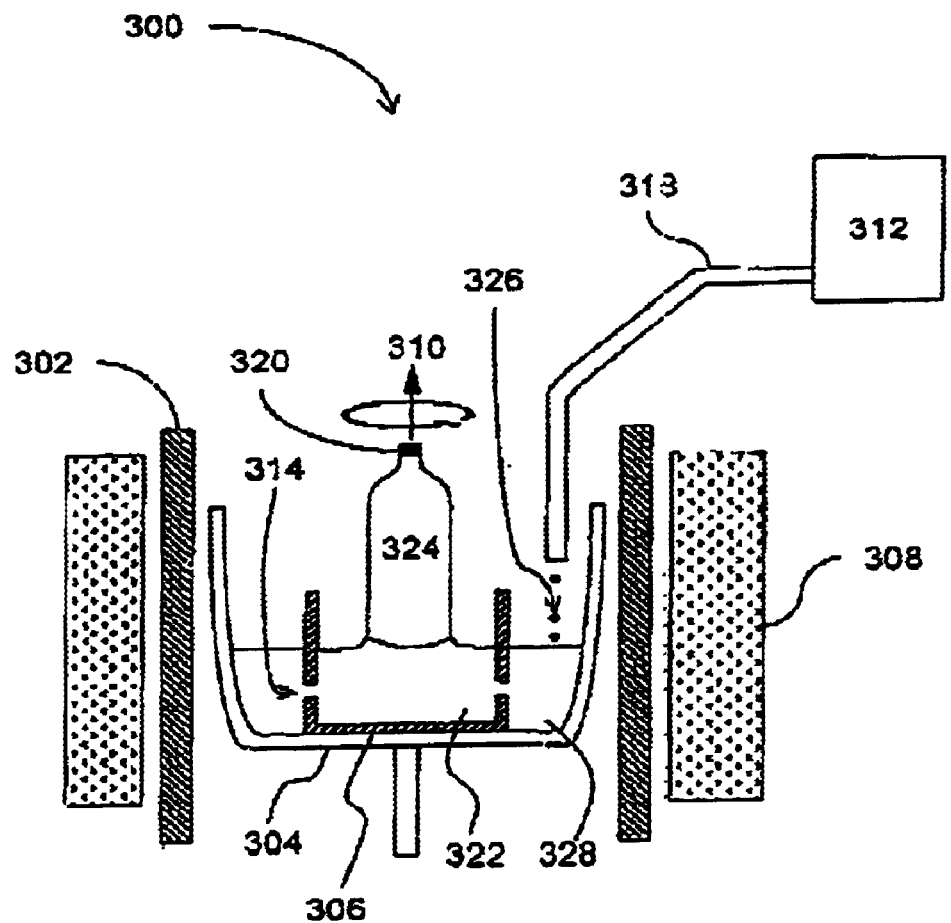
FIG. 3 is a schematic, cross-sectional view of an apparatus used in a conventional double-crucible method.

A crystal seed 422 is placed in the crystal pulling system 412 and dipped into the zone stuff of the melting zone 414. The seed 422 is pulled up and rotated at a constant speed to grow a crystal body 424, under the condition that the pulling speed Uc of the seed 424 (cross sectional area, Ac) and the upward pushing rate (Uf) of the long crucible 404 (inner cross sectional area, Af) satisfy the relationship $\rho c \times Uc \times Ac = \rho f \times Uf \times Af$; $\rho c$ and $\rho f$ are the density of the crystal and the feed, respectively. As the crystal body 424 is gradually grown, the pushing/rotating system 410 pushes the long crucible 404 upward to melt the solid feed material near the melting zone 414 at a proper temperature. A solid-liquid phase 426 can be thereby kept at a substantially the same level. The proper temperature recited above can be the point A of FIG. 1 and FIG. 2, for example. The crystal body has a well-controlled diameter and composition after a self-stabilization stage of heat transfer. The method of the present invention is particularly more convenient than that of the prior art. The crystal body obtained by the present invention has axial and radial compositions with improved uniformity. More particularly, the stoichiometric ratio of Lithium and Niobium, or Lithium and tantalum is about 1, which means the optical properties of LN and LT are superior to those obtained non-stoichiometrically. If a doping system is further used, the solid feed material in the feeding zone 416 is doped with a dopant which has a concentration $C_0$. The zone stuff in the melting zone 414 has a dopant concentration $C_0/K$ (wherein K is a segregation constant). The dopant can be magnesium oxide, zinc oxide, manganese, cerium, terbium, or iron.

EXAMPLE

Figure 6:
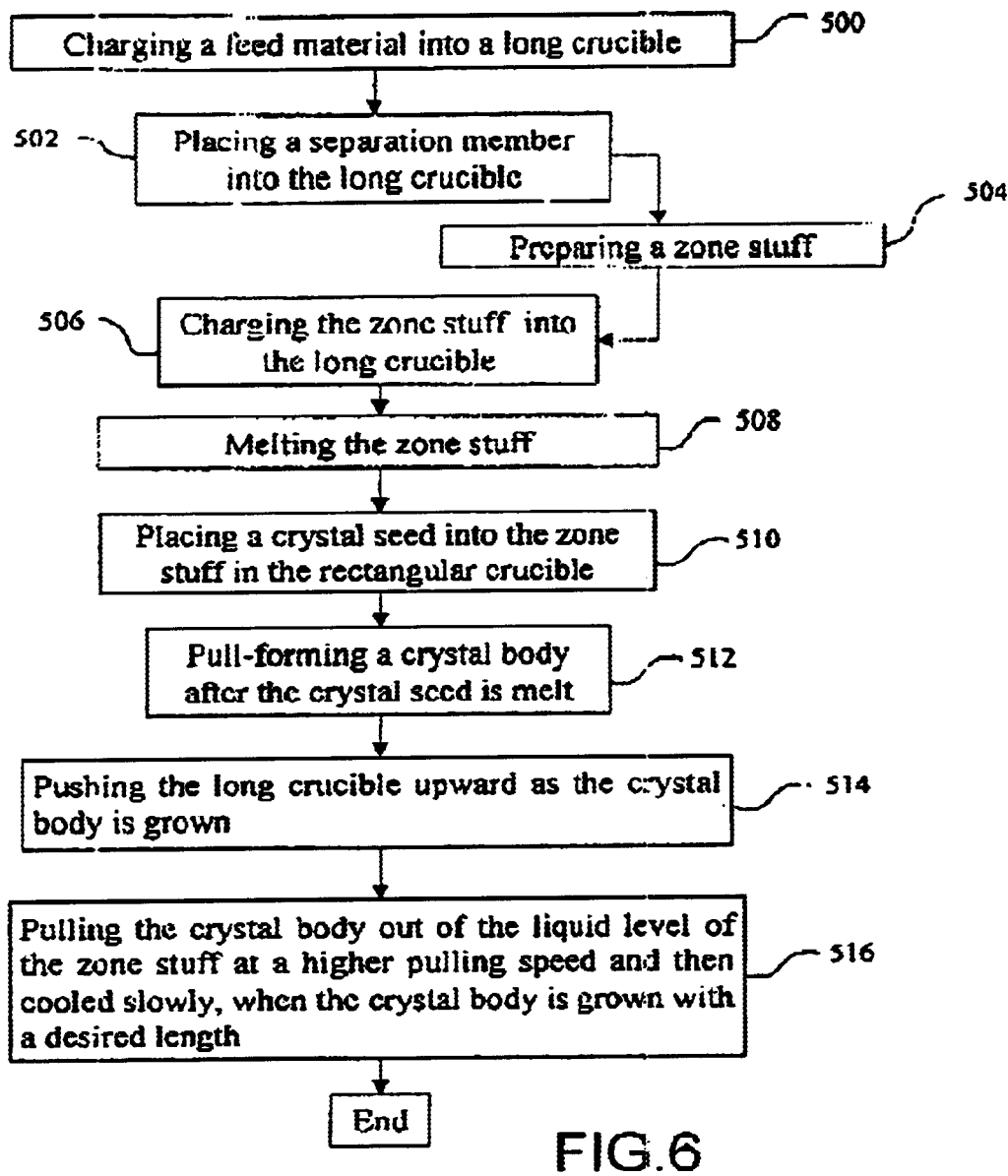
FIG. 6 is a flow chart showing a method of growing stoichiometric lithium niobate and lithium tantalate single crystals according to one preferred embodiment of the present invention.

The following examples illustrate the present invention in more detail with reference to FIG. 6.

FIG. 6 is a flow chart of a method of growing stoichiometric lithium niobate and lithium tantalate single crystals according to one preferred embodiment of the present invention.

With reference to FIG. 6, the solid feed material is charged in the long crucible (step 500). The solid feed material has substantially stoichiometric composition of LN or LT. Preferably, the solid feed material includes at the molar ratio of 1:1. The feed material is either solidified in batches, quenching from a molten state, or sintered to obtain stoichiometric solids before charged in the long crucible. Alternatively, the specific powder material which is previously prepared is charged in the long crucible.

The separation member 406 is placed in the long crucible (step 502). A zone stuff is prepared (step 504). The zone stuff includes 58%–60% $Li_2O/(Li_2O+Nb_2O_5)$ or 58–60% $Li_2O/(Li_2O+Ta_2O_5)$. The zone stuff is charged into the long crucible (step 506). The zone stuff is melted (step 508). A molten phase of the solid feed material that near the melting zone is also separated from a non-molten phase of the solid feed material by the separation member. The non-molten phase of the solid feed material in the feeding zone 416 is kept dense. Therefore, the step 502 is preferable because it helps not only to prevent bubbles generated when the solid feed material is melted from being included in the crystal body, but also to well control the admix rate of the solid feed material in the feeding zone and the zone stuff in the melting zone.

The crystal seed 422 is dipped in the zone stuff in the melting zone by means of a crystal pulling system (step 510). After the crystal seed is melted, the crystal pulling system 412 pulls the crystal seed up while rotating the crystal seed to grow a crystal body (step 512). The zone stuff is consumed as the crystal is grown, and replenished with the underlying feed material that has turn into melt near the melting zone 414. Therefore, the long crucible 404 is pushed upward by means of, for example, a pushing/rotating system as the crystal body is grown (step 514).

Further, the pushing rate of the long crucible 404 is in relation with the pulling rate of the crystal body. That is, the ratio of the pulling rate of the crystal body and the pushing rate of the long crucible, depending on the density of the feed, is about equal to the ratio of the inner cross sectional area of the long crucible and the cross sectional area of the crystal body. For example, when the crystal body to be grown has a diameter that is half of the diameter of the long crucible, the pushing rate of the long crucible is one fourth of the pulling rate of the crystal body. In a step 516, once the crystal body with a desired length is obtained, the crystal body is pulled out of the liquid level of the zone stuff melt at a higher pulling speed, and then is cooled down slowly. The crystal body is removed after cooling to room temperature.

The present invention has the following advantages over the prior art.

1. With the apparatus of the present invention having the long crucible with or without the separation member, it is much easier to grow a crystal body with a controlled composition.

2. The solid feed material can be solidified in batches, quenched from a molten state, or sintered before charged into the long crucible. The zone stuff is consumed as the crystal is grown, and replenished with the underlying feed material that has turn into melt near the melting zone.

3. By defining the melting zone in the long crucible, the stoichiometry and the dopant concentration of the axial and radial composition can be well controlled. Furthermore, the control of the diameter of the crystal body is easily achieved.

4. The required heat is applied around the sidewall of the external crucible, instead of the whole apparatus. Therefore, energy consumption and thus fabrication cost are reduced.

5. The arrangement of the separation member in the long crucible further enables the control the admix rate of the zone stuff in the melting zone and the solid feed material in the feeding zone. It also prevents bubbles generated by melting the solid feed material from being included in the crystal body.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. An apparatus for growing stoichiometric lithium niobate and lithium tantalate single crystals, the apparatus comprising:

a chamber, a crystal pulling system, a long crucible arranged inside the chamber;

a separation member arranged in the long crucible to divide an inner space of the long crucible into a melting zone and a feeding zone, wherein the melting zone is located above the feeding zone;

a heating system surrounding a sidewall of the chamber; and a pushing/rotating system arranged under the long crucible to rotate and push the long crucible.

2. The apparatus of claim 1, wherein the separation member comprises an insulative plate, a shallow crucible, and a crucible with a perforated wall.

3. The apparatus of claim 1, wherein the separation member is made of a material selected from platinum.

4. The apparatus of claim 1, wherein the separation member is made of a material selected from iridium.

5. The apparatus of claim 1, further comprising a preheater outside the chamber, corresponding to the position of the feeding zone.

6. The apparatus of claim 1, further comprising a post-heater outside the chamber, corresponding to the upper portion of the long crucible.

7. An apparatus for growing stoichiometric lithium niobate and lithium tantalate single crystals, the apparatus comprising:

a chamber, a crystal pulling system arranged above the chamber, a long crucible arranged inside the chamber;

a heating system surrounding sidewall of the chamber; and a pushing/rotating system arranged under the long crucible to rotate and push up the long crucible.

8. The apparatus of claim 7, wherein the heating system further comprises a preheater outside the chamber, corresponding to the position of the feeding zone.

9. The apparatus of claim 7, wherein the heating system further comprises a post-heater outside the chamber corresponding to the upper portion of the long crucible.

* * * * *